US006958939B2

(12) United States Patent
Hsieh et al.

(10) Patent No.: US 6,958,939 B2
(45) Date of Patent: Oct. 25, 2005

(54) FLASH MEMORY CELL HAVING MULTI-PROGRAM CHANNELS

(75) Inventors: Chia-Ta Hsieh, Tainan (TW); Chin-Huang Wang, Ping-Zhen (TW); I-Ming Chang, Shinchu (TW); Hsiang-Tai Lu, Hsin-Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/663,425

(22) Filed: Sep. 15, 2003

(65) Prior Publication Data

US 2005/0057971 A1 Mar. 17, 2005

(51) Int. Cl.[7] ................................................ G11C 16/04

(52) U.S. Cl. ............................ 365/185.28; 365/185.18; 365/185.33

(58) Field of Search ....................... 365/185.28, 185.18, 365/185.33

(56) References Cited

U.S. PATENT DOCUMENTS

| | | | | |
|---|---|---|---|---|
| 5,411,905 A | | 5/1995 | Acovic et al. | |
| 5,998,829 A | * | 12/1999 | Choi et al. | 257/315 |
| 6,009,017 A | * | 12/1999 | Guo et al. | 365/185.28 |
| 6,054,350 A | | 4/2000 | Hsieh et al. | |
| 6,074,914 A | | 6/2000 | Ogura | |
| 6,157,058 A | | 12/2000 | Ogura | |
| 6,248,633 B1 | | 6/2001 | Ogura et al. | |
| 6,326,661 B1 | | 12/2001 | Dormans et al. | |
| 6,477,085 B1 | | 11/2002 | Kuo | |
| 6,754,103 B2 | * | 6/2004 | Frayer | 365/185.03 |
| 2002/0045319 A1 | | 4/2002 | Ogura et al. | |
| 2002/0109181 A1 | | 8/2002 | Hsieh et al. | |

FOREIGN PATENT DOCUMENTS

| | | |
|---|---|---|
| JP | 2002170891 A | 6/2002 |
| WO WIPO | PCT/JP01/10156 | 11/2001 |

OTHER PUBLICATIONS

Vandana Verma and Andrew Swaneck, "Proposed On–Chip Test Structure To Quantify Trap Densities Within Flash Memories", Proceedings of the 1996 IEEE International Workshop On Memory Technology, Design and Testing (MTDT '96), pp. 22–26.

* cited by examiner

*Primary Examiner*—Huan Hoang
(74) *Attorney, Agent, or Firm*—Duane Morris LLP

(57) ABSTRACT

A flash memory cell of an EEPROM split-gate flash memory, the memory cell including a substrate having a plurality of active regions, and a floating gate structure disposed over the substrate. The floating gate structure extends across at least three of the active regions of the substrate such that the floating gate structure and the at least three active regions define at least two channel regions dedicated for programming.

19 Claims, 9 Drawing Sheets

FLASH MEMORY CELL HAVING MULTI-PROGRAM CHANNELS

FIELD OF THE INVENTION

The present invention relates to semiconductor memories. More particularly, the present invention relates to a flash memory cell of an EEPROM split-gate flash memory, having two or more channels dedicated for programming.

BACKGROUND OF THE INVENTION

FIGS. 1A–1C collectively illustrate a flash memory cell 100 of a conventional EEPROM split-gate flash memory (SGFM). The cell 100 includes: a floating gate 101 formed by a floating gate poly layer 102, a floating gate oxide layer 103, and a poly oxidation layer 104; a control gate or word line 105; and an interpoly layer 106 separating the floating gate 101 and the word line 105. The cell 100 further includes a single channel 107 which doubles as both a program channel and a read channel.

Conventional flash memory cells are associated with some disadvantages. One disadvantage is that electron trapping during programming impacts program injection. After long cycles, electron trapping increases and results in program failure. Another disadvantage is that the negative charges from electron trapping lowers the channel reading current for an erased cell, so that after long cycles, electron trapping increases and results in erase failure.

Accordingly, there is a need for a flash memory cell, which avoids the aforementioned disadvantages associated with conventional flash memory cells.

SUMMARY OF THE INVENTION

A flash memory cell comprising a substrate having a plurality of active regions, and a floating gate structure disposed over the substrate. The floating gate structure extends across at least three of the active regions of the substrate such that the floating gate structure and the at least three active regions define at least two channel regions dedicated for programming.

BRIEF DESCRIPTION OF THE DRAWINGS

FIGS. 2A–8A and 2B–8B collectively illustrate an exemplary method for fabricating a flash memory cell of an EEPROM split-gate flash memory, according to the present invention.

FIGS. 2A–8A are top views of a semiconductor substrate on which various process steps of the method are performed, and FIGS. 2B–8B are cross-sectional views through the substrate in each of FIGS. 2A–8A, illustrating the results of the process steps performed on the substrate.

DETAILED DESCRIPTION OF THE INVENTION

The present invention is a flash memory cell of an EEPROM split-gate flash memory, having multiple channels dedicated for programming. The inclusion of multiple channels in the cell decreases electron trapping during programming and erasing, thereby increasing the endurance of the cell.

The following discussion describes an exemplary method for fabricating a flash memory cell of a split-gate flash memory according to the present invention. FIGS. 2A–8A are top views of a semiconductor substrate on which various process steps of the method are performed, and FIGS. 2B–8B are cross-sectional views through the substrate in each of FIGS. 2A–8A, illustrating the results of the process steps performed on the substrate.

Figure 1A:
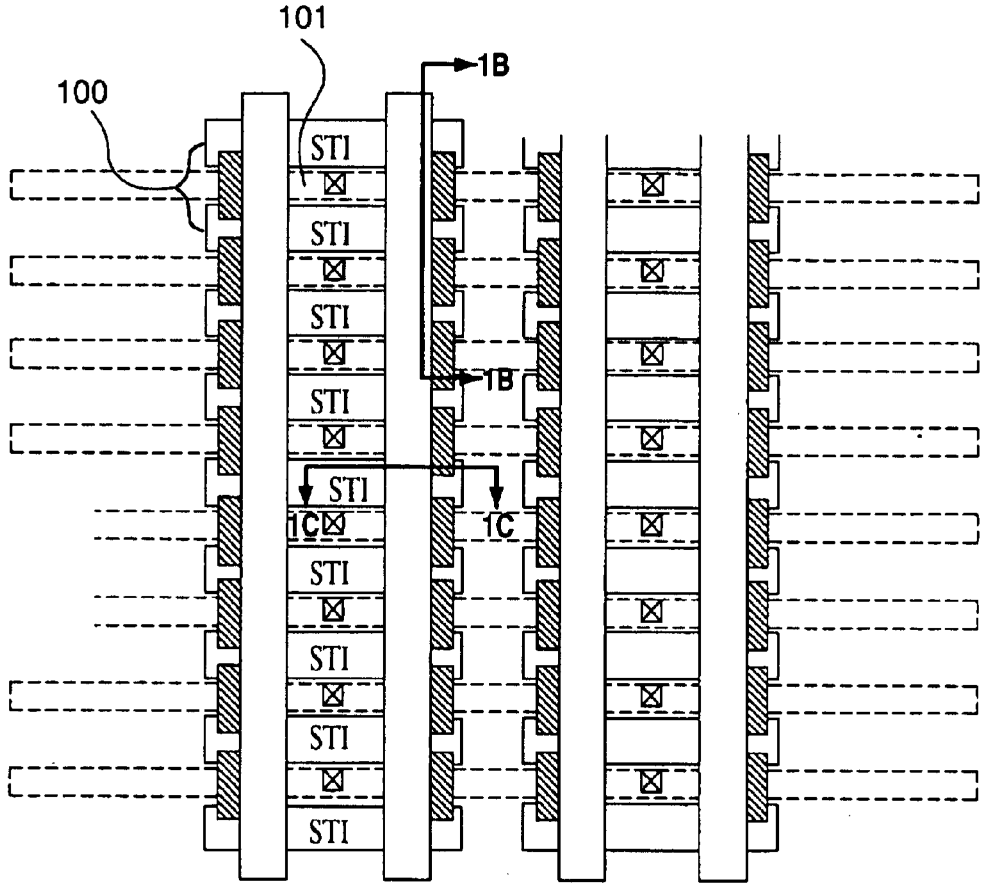
FIG. 1A is a top plan view of a flash memory cell of a conventional EEPROM split-gate flash memory.
Figure 1B:
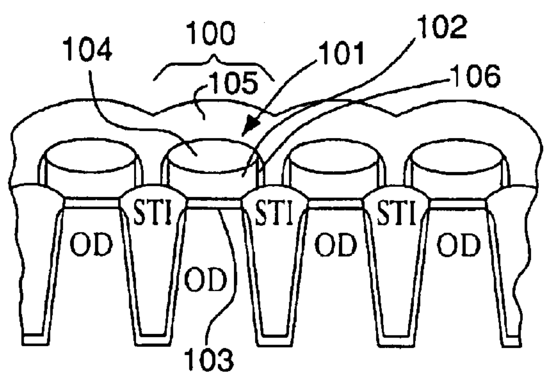
FIG. 1B is a section view through line 1B—1B of FIG. 1A.
Figure 1C:
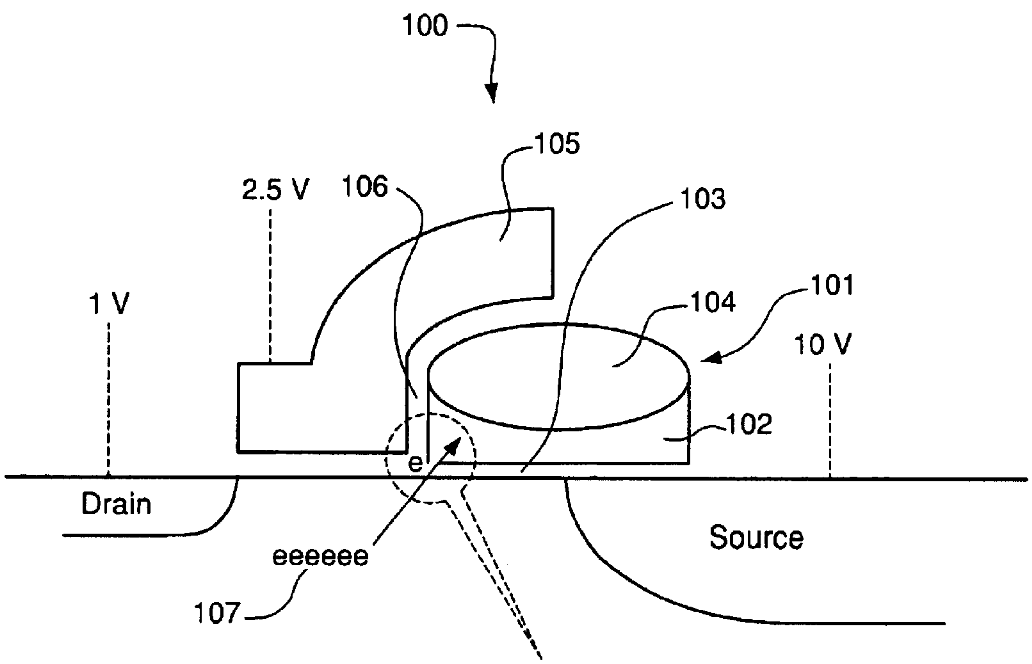
FIG. 1C is a section view through line 1C—1C of FIG. 1A.
Figure 2B:
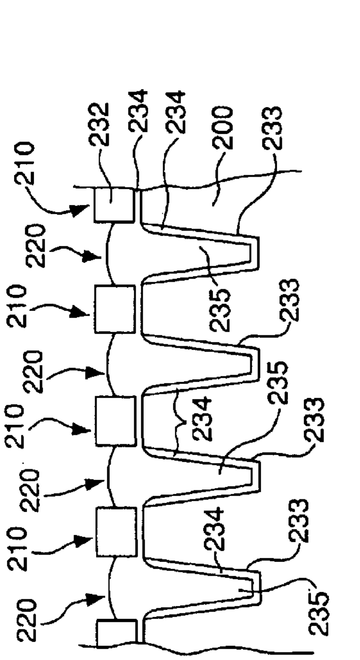
Figure 2A:
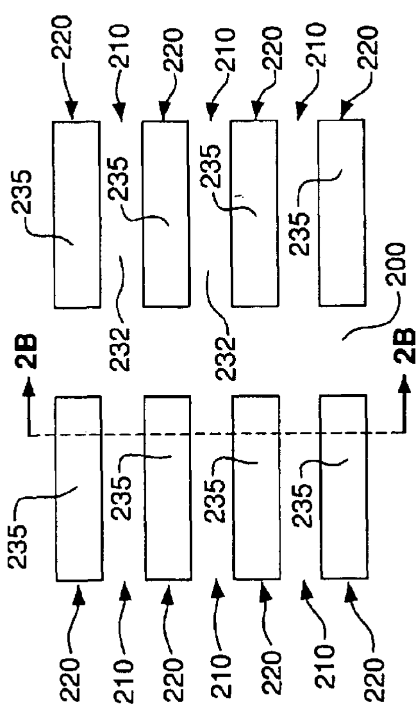

Referring to FIGS. 2A and 2B, and initially to the top view of FIG. 2A there is shown a semiconductor substrate 200, which may be composed of silicon, having defined therein active regions 210 and shallow trench isolation regions (STI) 220. As shown in the cross-sectional view of FIG. 2B, the active and STI regions 210, 220 may be fabricated by first forming a silicon dioxide (oxide) layer 231 over the substrate 200 using a thermal growing or chemical vapor deposition CVD process.

Next, a first nitride layer 232 is formed over the oxide layer 231. The first nitride layer 232 may be formed using, for example, a low pressure chemical vapor deposition (LPCVD) process. A first photoresist layer (not shown) is formed over the first nitride layer 232 and subsequently patterned using conventional photolithographic processes to define the active regions 210. The exposed portions of the first nitride layer 232 are then etched using a dry etching process, and the underlying portions of the oxide layer 231 are then etched using a dry or wet etching process. The dry or wet etching process is then continued into the substrate 200 to form trenches 233. The photoresist layer is removed using, for example, an oxygen plasma ashing process, and then the walls of the trenches 233 are lined with a layer 234 of $SiO_2$, which may be formed using a thermal growing process. The trenches are then filled with isolation oxide 235, using LPCVD or high-density-plasma (HDP) thus forming the STI regions 220.

Figure 3B:
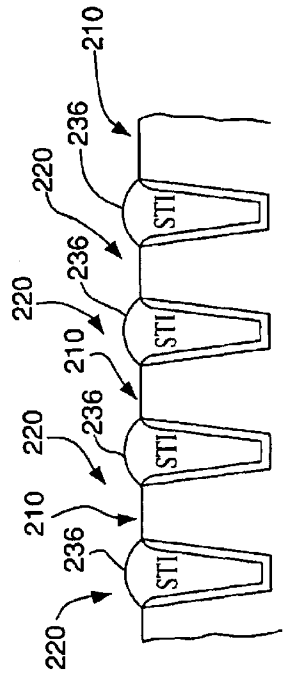
Figure 3A:
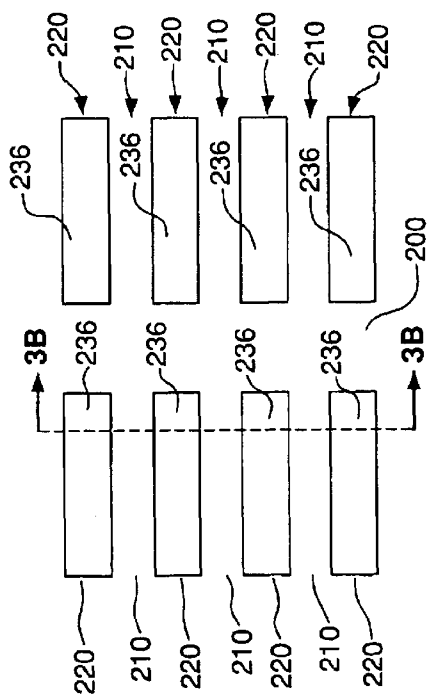

FIGS. 3A and 3B collectively show the substrate 200 after chemical-mechanical polishing (CMP), removal of the nitride 232 and oxide 231 layers, and oxide cap formation. The nitride layer 232 may be removed using a HDP etching process with a recipe comprising $O_2$, $SF_6$, $CF_4$, and He. The oxide layer 231 underlying the nitride layer 232 may be removed using either a dry or wet etch. Subsequently, a sacrificial oxide (not shown) is formed and removed, as is practiced in the art, in order to remove any process related damage in the substrate 200. The resulting structure shows oxide caps 236 that protrude above the STI regions 220 as seen in FIG. 3B.

Figure 4B:
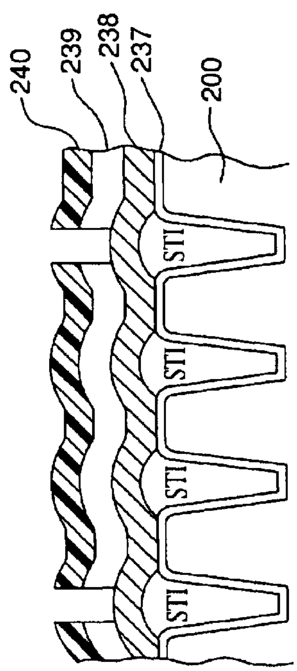
Figure 4A:
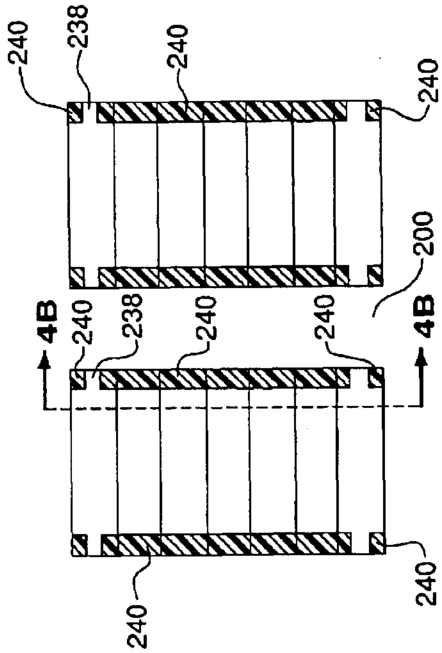

As collectively shown in FIGS. 4A and 4B, a floating gate oxide layer 237 is formed over the substrate 200. The formation of the floating gate oxide layer 237 may be accomplished by thermally growing at a temperature range between about 800 to 950° C. The thickness of the floating gate oxide layer 237 is typically between about 80 angstroms to about 100 angstroms. Then, a floating gate polysilicon layer 238 is deposited over the floating gate oxide layer 237. The floating gate polysilicon layer 238 may be formed by a LPCVD method utilizing silane $SiH_4$ as a silicon source material at a temperature range between about 500 to 650° C. The floating gate polysilicon layer 238 may also be formed using other methods including, without limitation CVD and Physical Vapor Deposition (PVD) sputtering, employing suitable silicon source materials. The thickness of the floating gate polysilicon layer 238 is typically between about 600 angstroms to about 1600 angstroms. A second nitride layer 239 is then formed over the floating gate polysilicon layer 238 using, for example, a LPCVD process wherein dichlorosilane ($SiCl_2H_2$) is reacted with ammonia ($NH_3$) at a temperature between about 700 to 850° C.

Floating gates made in accordance with the present invention are next defined by forming a second photoresist layer 240 over the second nitride layer 239 and subsequently patterning the second photoresist layer 240 as shown in FIGS. 4A and 4B using conventional photolithographic processes. The second nitride layer 239 is next etched through the patterned second photoresist layer 240 until portions of the floating gate polysilicon layer 238 are exposed. The second nitride layer 239 may etched using a dry etching process.

Figure 5B:
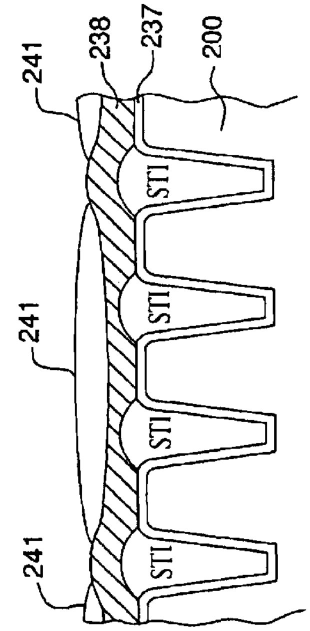
Figure 5A:
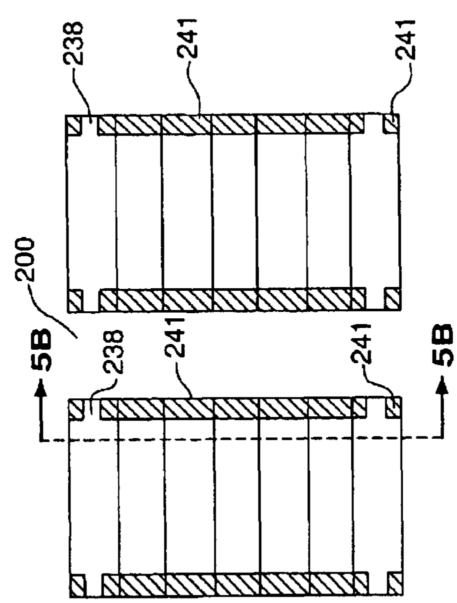

As collectively shown in FIGS. 5A and 5B, the second photoresist layer 240 has been removed and the patterned second nitride layer 239 used as a mask, to form a poly-oxide layer 241 on the exposed portions of the floating gate polysilicon layer 238 using, for example, a wet oxidization process. FIGS. 5A and 5B depict the substrate 200 after removal of the second nitride layer 239, using for example, a wet etching process with a recipe of $H_3PO_4$, following the poly-oxide formation.

Figure 6B:
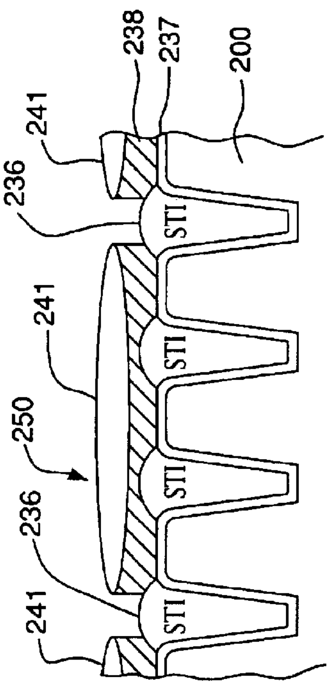
Figure 7B:
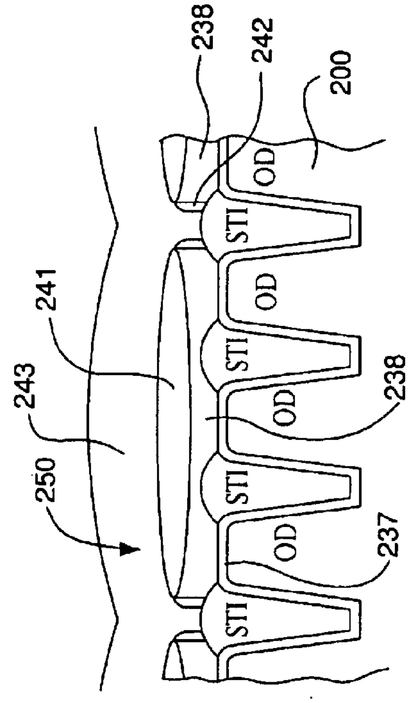
Figure 6A:
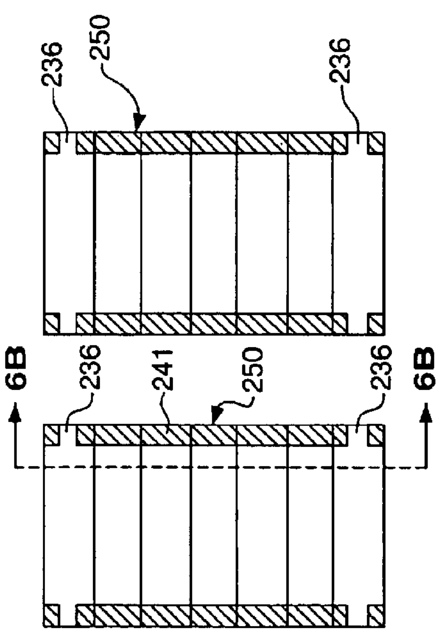
Figure 7A:
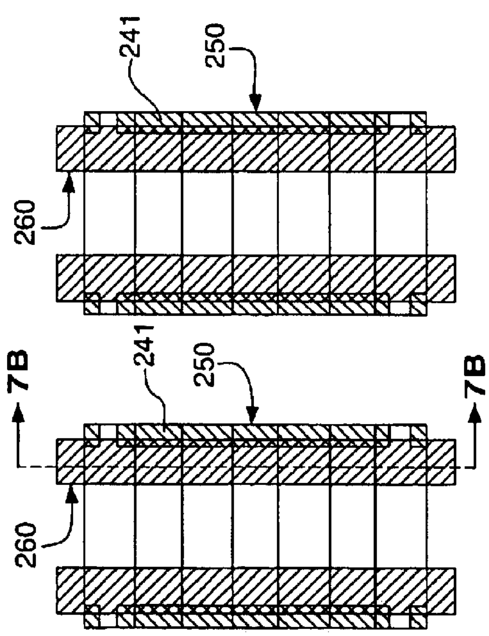

As collectively shown in FIGS. 6A and 6B, the poly-oxide layer 241 has subsequently served as a hard mask to etch the floating gate polysilicon layer 238 down to the STI oxide caps 236, which along with the floating gate oxide layer 237 operate as an etch stop, to form floating gate structures 250 that each extend over at least three active regions 210 of the substrate 200 to provide flash memory cells which each have multiple channels dedicated for programming. Etching of the floating gate polysilicon layer 238 may be accomplished using a dry etch recipe comprising HBr, $O_2$, and $Cl_2$ As collectively shown in FIGS. 7A and 7B, an interpoly oxide 242 has been conformally formed over the sidewall and legs of the extended floating gates 250 followed by a conformal control gate polysilicon layer 243. The interpoly oxide 242 may be formed using conventional thermal growth or high temperature oxidation methods. The control gate polysilicon layer 234 may be formed using the same process as used for forming the floating gate polysilicon layer 238. As shown in FIG. 7A, the control gate polysilicon layer 243 has been etched (after formation of a patterned photoresist layer, which is not shown in the drawings) to form control gates 260 by using a recipe comprising HBr, $O_2$ and $Cl_2$.

Figure 8A:
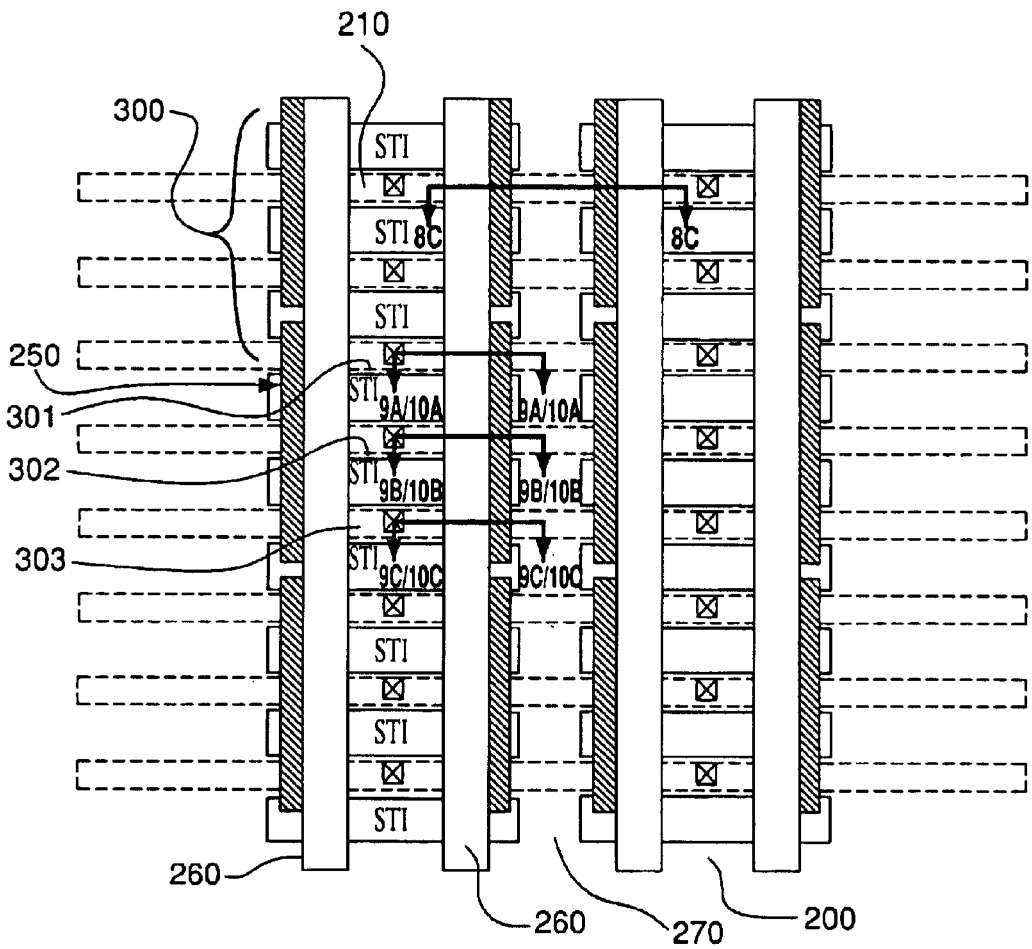
Figure 8B:
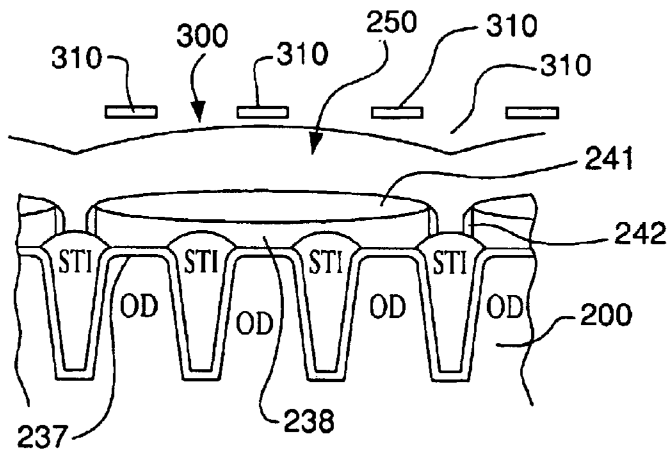
Figure 8C:
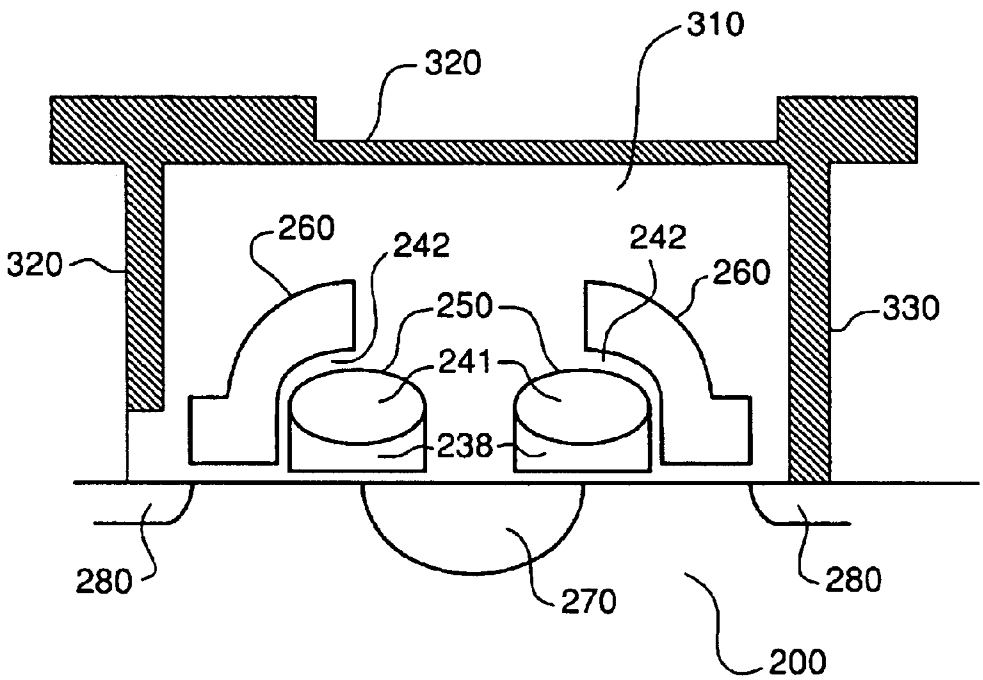
FIG. 8C is a cross-sectional view of the flash memory cell of the present invention.

As collectively shown in FIGS. 8A and 8C, a common source 270 and drains 280 have been conventionally defined in the substrate 200 and source and drain implantations have been performed, to complete flash memory cells 300. The source implantation may be performed using, for example, phosphorus ions at a dosage level between about $1\times10^{15}$ to $1\times10^{16}$ atoms/cm$^2$ and an energy level between about 20 to 60 KEV. Similarly, the drain implantation may be performed using, for example, arsenic ions at a dosage level between about $1\times10^{15}$ to $1\times10^{16}$ atoms/cm$^2$ and energy level between about 20 to 60 KEV.

In FIG. 8B, a dielectric layer 310 including a plurality of metal bit lines 320, metal source lines (not shown) and electrically conductive vias 330 (FIG. 8C) extending therethrough, has been formed over the memory cells 300. The dielectric layer and the bit lines, source lines, and vias may be formed using known methods.

Referring again to FIG. 8A, each cell 300 may include a first program channel 301 and a second program channel 302, and a read channel 303. Virtually any desired number of additional program channels can be provided by forming the extended floating gates 250 across the appropriate number of active regions 210 of the substrate 200.

Figure 9A:
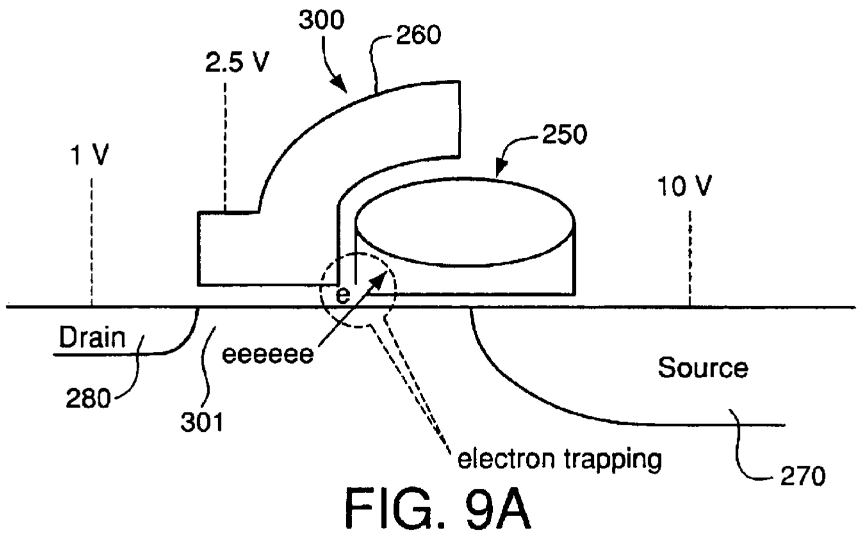
FIGS. 9A–9C illustrate one method for programming the channels of the memory cell of the present invention.
Figure 9B:
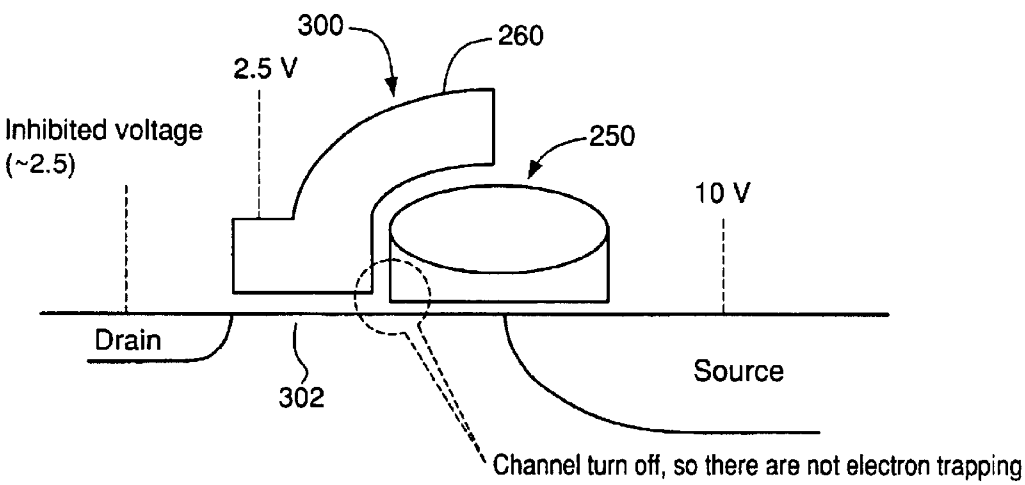
Figure 9C:
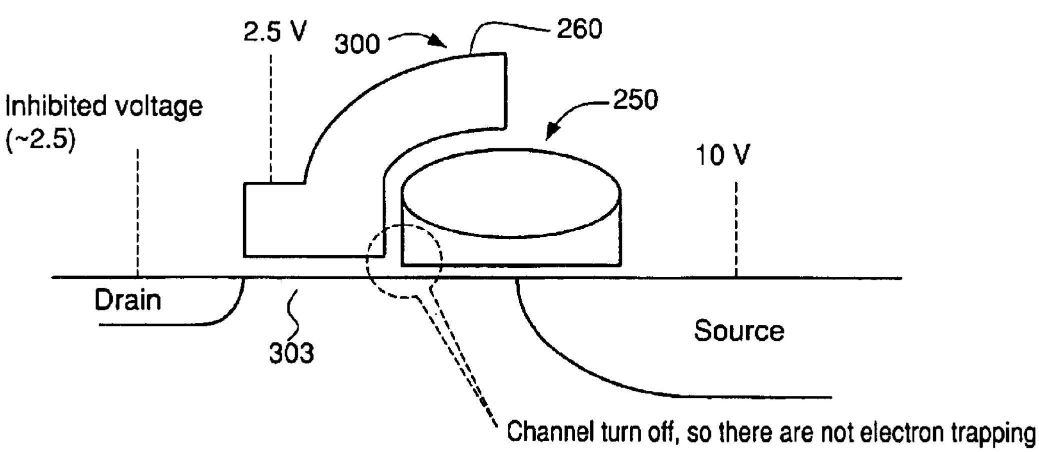

A method for programming the memory cell of the present invention will now be described with reference to FIGS. 9A–9C. In accordance with this method, programming the cell 300 "turns-on" only one of the first and second program channels 301, 302. For example, a programming voltage may be applied to the drain 280 of the first program channel 301, while an inhibited voltage may be applied to the drain 280 of the second program channel 302, to turn-on the first channel 301 and turn-off the second program channel 302 during programming of the cell 300. The read channel 303 is turned off during programming by the application of an inhibited voltage applied to the read channel drain 280. Thus, during cell programming, electron trapping occurs only in the first programming channel as shown in FIG. 9A, and no electron trapping occurs in either the second programming channel 302 as shown in FIG. 9B, or the read channel 303 as shown in FIG. 9C.

Although not illustrated, the programming voltage may also be applied to the drain 280 of the second program channel 302 and the inhibited voltage may be applied to the drain 280 of the first program channel 301. The probability of turn-on during programming is virtually the same for the first and second program channels 301, 302 after cycling over a long time periods. Hence, the probability of electron trapping in the floating gate oxide of each of the program channels 301, 302 can be decreased by one-half. The probability of electron trapping can be further reduced by providing additional program channels in each cell 300. The decreased probability of electron trapping on the floating gate oxide of each programming channel 301, 302 of the cell 300, results in at least a doubling of the endurance time of the cell 300 during cycling. The read channel 303 is always turned-off by an inhibited voltage during programming, so electron trapping does not occur in the read channel 303 during programming.

Another method for programming the memory cell of the present invention will now be described with reference to FIGS. 10A–10C. In this alternate method, cell programming is accomplished by applying a programming voltage simultaneously to the drains 280 of the first and second program channels 301, 302, which simultaneously turns-on the first and second program channels 301, 302. The read channel 303 is turned off during programming by the application of an inhibited voltage applied to the read channel drain 280. Although electron trapping occurs in both the first and second programming channels as shown in FIGS. 9A and 9B respectively (no electron trapping occurs in the read channel 303 during programming as shown in FIG. 9C), the programming time for each of the two program channels 301, 302 decreases by one-half. Accordingly, the probability of electron trapping in the floating gate oxide of each of the program channels 301, 302 can also be decreased by one-half.

Figure 10A:
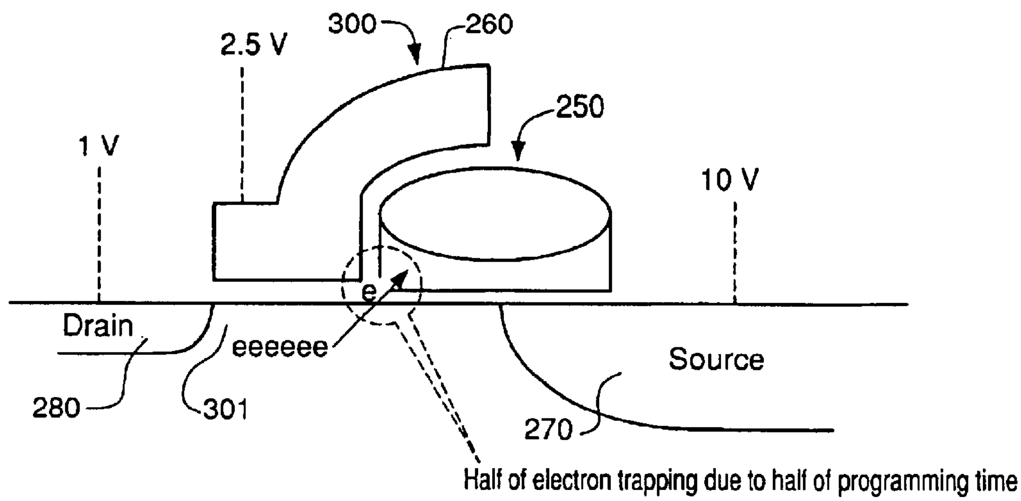
FIGS. 10A–10C illustrate another method for programming the channels of the memory cell of the present invention.
Figure 10B:
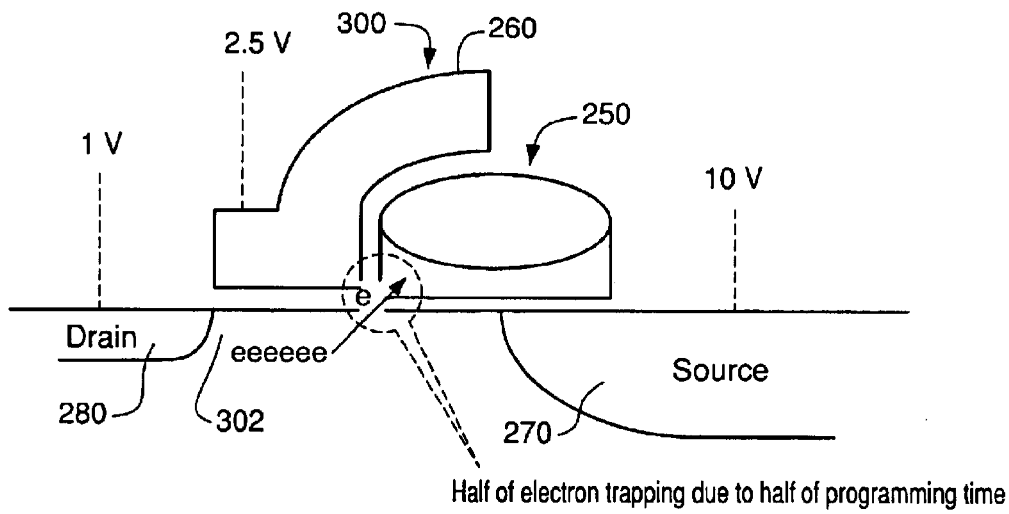
Figure 10C:
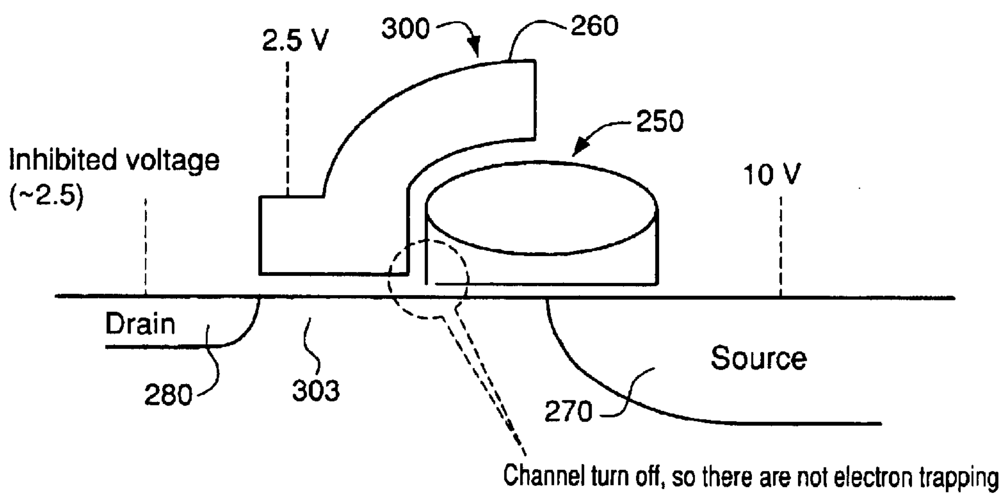

The probability of electron trapping can be further reduced in the programming embodiment of FIGS. 10A–10C, by providing additional program channels in each cell 300. The decreased probability of electron trapping on the floating gate oxide of each programming channel 301, 302 of the cell 300, results in at least a doubling of the endurance time of the cell 300 during cycling. The read channel 303 is always turned-off by an inhibited voltage during programming, so electron trapping does not occur in the read channel 303 during programming.

While the foregoing invention has been described with reference to the above embodiments, various modifications and changes can be made without departing from the spirit of the invention. Accordingly, all such modifications and changes are considered to be within the scope of the appended claims.

What is claimed is:

1. A flash memory cell comprising:

a substrate having a plurality of active regions and a source region; and a floating gate structure disposed over the substrate, the floating gate structure extending across at least three of the active regions of the substrate and parallel with the source region;

wherein the floating gate structure and the at least three active regions define at least two channel regions dedicated for programming.

2. The flash memory cell according to claim 1, further comprising a control gate structure at least partially disposed over the floating gate structure, the control gate structure associated with at least three drain regions of the substrate.

3. The flash memory cell according to claim 2, wherein the floating gate and control gate structures comprise a split gate structure.

4. The flash memory cell according to claim 2, further comprising an intergate dielectric disposed between the floating and control gate structures.

5. The flash memory cell according to claim 2, wherein the channel regions are disposed between the source region and each of the at least three drain regions.

6. The flash memory cell according to claim 1, wherein the memory cell comprises an EEPROM split-gate flash memory.

7. A method of fabricating a flash memory cell, the method comprising the steps of:

providing a substrate having a plurality of active regions and a source region; and forming a floating gate structure over the substrate and across at least three of the active regions of the substrate, the floating gate structure parallel with the source region;

wherein the floating gate structure and the at least three active regions define at least two channel regions dedicated for programming.

8. The method according to claim 7, further comprising the step of forming a control gate structure at least partially over the floating gate structure.

9. The method according to claim 8, further comprising the steps of:

forming at least three drain regions in the substrate, the control gate structure being associated with the drain regions.

10. The method according to claim 9, wherein the channel regions are disposed between the source region and each of the at least three drain regions.

11. The method according to claim 8, wherein the floating gate and control gate structures comprise a split gate structure.

12. The method according to claim 8, further comprising the step of forming an intergate dielectric between the floating and control gate structures.

13. The method according to claim 7, wherein the memory cell comprises an EEPROM split-gate flash memory.

14. A method of programming a flash memory cell having a substrate including a plurality of active regions, a floating gate structure disposed over the substrate and associated with a source region of the substrate, the floating gate structure extending across at least three of the active regions of the substrate, the floating gate structure and the at least three active regions defining at least two channel regions dedicated for programming, and a control gate structure at least partially disposed over the floating gate structure, the control gate structure associated with at least three drain regions of the substrate, the method comprising the steps of:

applying a programming voltage to a first one of the at least three drain regions; and applying an inhibiting voltage to a second one of the at least three drain regions.

15. The method according to claim 14, further comprising the step of applying an inhibiting voltage to a third one of the at least three drain regions.

16. The method according to claim 14, wherein the memory cell comprises an EEPROM split-gate flash memory.

17. A method of programming a flash memory cell having a substrate including a plurality of active regions, a floating gate structure disposed over the substrate and associated with a source region of the substrate, the floating gate structure extending across at least three of the active regions of the substrate, the floating gate structure and at least two of the at least three active regions defining two channel regions dedicated for programming, and a control gate structure at least partially disposed over the floating gate structure, the control gate structure associated with at least three drain regions of the substrate, the method comprising the steps of:

applying a programming voltage to a first one of the at least three drain regions; and applying an inhibiting voltage to a second one of the at least three drain regions;

wherein the voltage applying steps are performed simultaneously.

18. The method according to claim 17, further comprising the step of applying an inhibiting voltage to a third one of the at least three drain regions.

19. The method according to claim 17, wherein the memory cell comprises an EEPROM split-gate flash memory.

* * * * *